US007724518B1

(12) United States Patent
Carlson et al.

(10) Patent No.: US 7,724,518 B1
(45) Date of Patent: May 25, 2010

(54) ORTHOGONALLY SYSTEM ARRANGEMENTS FOR DATA CENTER FACILITY

(75) Inventors: Andrew B. Carlson, Atherton, CA (US); William Hamburgen, Palo Alto, CA (US); Jimmy Clidaras, Los Altos, CA (US); Wolf-Dietrich Weber, San Jose, CA (US); Xiaobo Fan, Sunnyvale, CA (US)

(73) Assignee: Exaflop LLC, Mountain View, CA (US)

( * ) Notice: Subject to any disclaimer, the term of this patent is extended or adjusted under 35 U.S.C. 154(b) by 0 days.

(21) Appl. No.: 12/146,281

(22) Filed: Jun. 25, 2008

Related U.S. Application Data

(60) Provisional application No. 60/946,699, filed on Jun. 27, 2007.

(51) Int. Cl.
*H05K 7/20* (2006.01)
*G06F 1/20* (2006.01)
*E04C 2/52* (2006.01)

(52) U.S. Cl. .................. 361/679.53; 361/699; 361/701; 361/716; 165/104.33; 52/220.1; 52/220.3

(58) Field of Classification Search ............ 361/679.46, 361/679.53, 699, 701, 715–716; 165/80.4, 165/104.33; 52/220.1, 220.3, 220.5, 263
See application file for complete search history.

(56) References Cited

U.S. PATENT DOCUMENTS

| 3,885,296 | A | * | 5/1975 | Stout ............................ 29/433 |
| RE33,220 | E | * | 5/1990 | Collier ......................... 52/263 |
| 5,053,637 | A | * | 10/1991 | Dillard ........................ 307/147 |
| 5,477,649 | A | * | 12/1995 | Bessert ........................ 52/263 |
| 6,061,982 | A | * | 5/2000 | Owen .......................... 52/220.1 |
| 6,061,984 | A | * | 5/2000 | Rose ........................... 52/220.1 |
| 6,918,217 | B2 | * | 7/2005 | Jakob-Bamberg et al. ..... 52/263 |
| 7,114,555 | B2 | * | 10/2006 | Patel et al. ................... 165/247 |
| 7,365,973 | B2 | * | 4/2008 | Rasmussen et al. ......... 361/694 |
| 7,477,514 | B2 | * | 1/2009 | Campbell et al. ............ 361/699 |
| 7,511,960 | B2 | * | 3/2009 | Hillis et al. ................. 361/702 |
| 7,542,285 | B2 | * | 6/2009 | Colucci et al. .............. 361/688 |
| 7,630,795 | B2 | * | 12/2009 | Campbell et al. ........... 700/300 |
| 2007/0025271 | A1 | * | 2/2007 | Niedrich et al. ............. 370/254 |
| 2008/0055846 | A1 | * | 3/2008 | Clidaras et al. ............. 361/687 |
| 2009/0031148 | A1 | * | 1/2009 | Densham ..................... 713/300 |
| 2009/0122487 | A1 | * | 5/2009 | Campbell et al. ........... 361/698 |
| 2009/0150123 | A1 | * | 6/2009 | Archibald et al. .............. 703/1 |

(Continued)

OTHER PUBLICATIONS

Luiz Andre Barroso et al.,"Web Search for a Planet: The Google Cluster Architecture", Mar./Apr. 2003, IEEE Micro, 23(2), pp. 22-28.

(Continued)

*Primary Examiner*—Jayprakash N Gandhi
*Assistant Examiner*—Robert J Hoffberg
(74) *Attorney, Agent, or Firm*—Fish & Richardson P.C.

(57) ABSTRACT

A facility is described that includes one or more enclosures defining an interior space, a plurality of power taps, a plurality of coolant supply taps, and a plurality of coolant return taps. A flow capacity of the supply taps and a flow capacity of the return taps can be approximately equal over a local area of the interior space. The plurality of power taps, the plurality of supply taps, and the plurality of return taps can be divided into a plurality of zones, with taps of each zone are configured to be controllably coupled to a power source or a coolant source independently of the taps of other zones. The taps can be positioned along paths, and paths of the power taps can be spaced from associated proximate paths of supply and return taps by a substantially uniform distance along a substantial length of the first path.

20 Claims, 14 Drawing Sheets

U.S. PATENT DOCUMENTS

2009/0150129 A1* 6/2009 Archibald et al. .............. 703/5
2009/0156114 A1* 6/2009 Ahladas et al. ............. 454/184
2009/0241578 A1* 10/2009 Carlson et al. ............. 62/259.2

OTHER PUBLICATIONS

Mark Early, P.E. et al., "645.5 Supply Circuits and Interconnecting Cables", 2005 Ed., National Electrical Code Handbook, National Fire Protection Association, pp. 956-957.

Taliver Heath et al., "Mercury and Freon: Temperature Emulation and Management for Server Systems", Oct. 21-25, 2006, In International Conference on Architectural Support for Programming Languages and Operating Systems (ASPLOS '06), pp. 106-116.

U.S. Appl. No. 12/144,409, filed Jun. 23, 2008, for "Cooling and Power Grids for Data Center."

U.S. Appl. No. 12/146,196, filed Jun. 25, 2008, for "Cooling and Power Paths for Data Center."

* cited by examiner

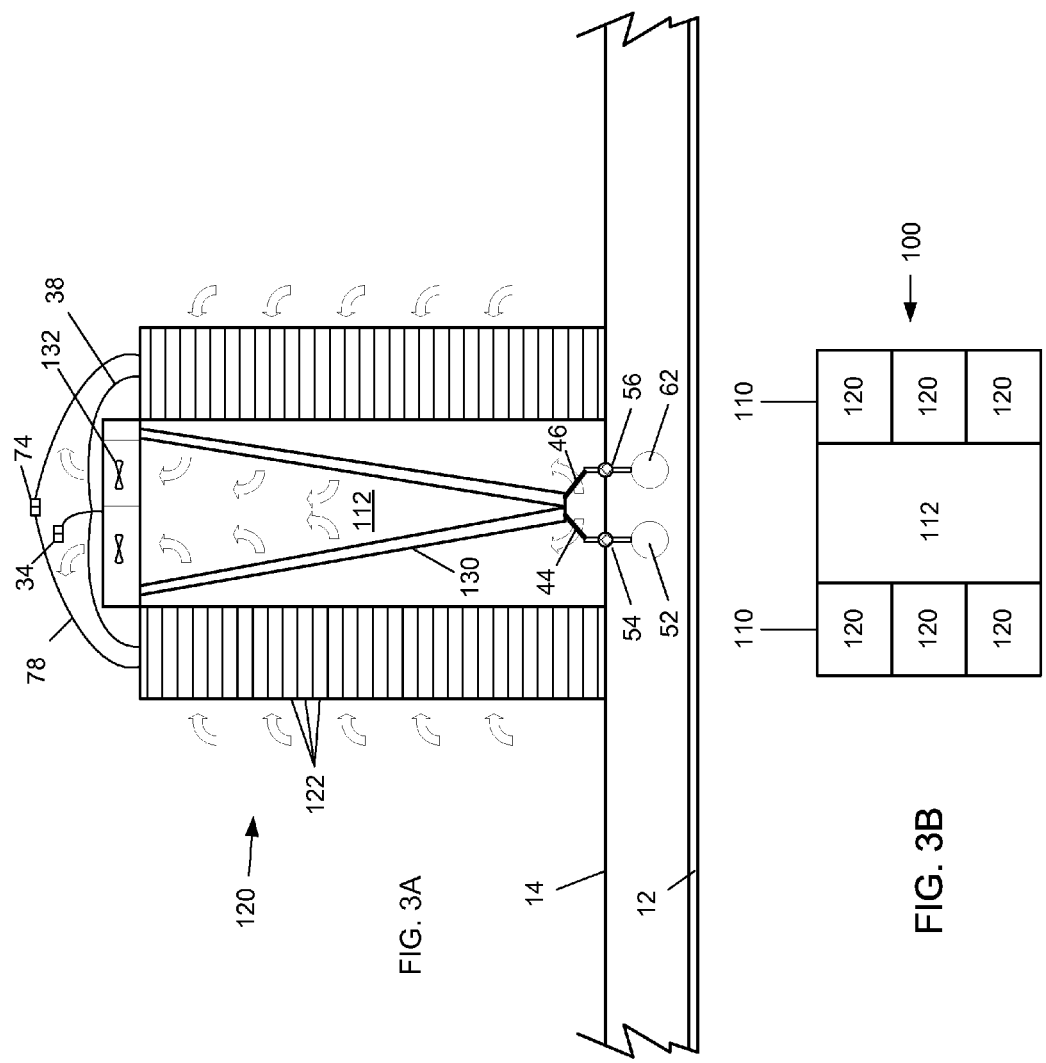

ORTHOGONALLY SYSTEM ARRANGEMENTS FOR DATA CENTER FACILITY

CROSS-REFERENCE TO RELATED APPLICATIONS

This application claims priority to U.S. Provisional Application Ser. No. 60/946,699, filed Jun. 27, 2007, the entire disclosure of which is incorporated by reference.

TECHNICAL FIELD

This document relates to systems and methods for providing cooling and power to an area containing electronic equipment, such as a computer data center containing server racks.

BACKGROUND

Higher speed computers come with a cost higher electrical consumption. For a small number of home PCs this extra power may be negligible when compared to the cost of running other electrical appliances in a household. However, in data center applications, where thousands or tens of thousands of microprocessors may be operated, electrical power consumption becomes important.

In addition, the power consumed by a microprocessor is transformed into heat. A pair of microprocessors mounted on a single motherboard can draw 200-400 watts or more of power. If that power draw is multiplied by several thousand (or tens of thousands) to account for the computers in a data center, the potential for heat generation can be appreciated. Thus, not only must a data center operator pay for electricity to operate the computers, it must also pay to cool the computers. The cost of removing heat may be a major cost of operating large data centers.

A typical approach to removing heat in a data center uses air conditioning, e.g., cold air is blown through the room containing the computers. For example, a current common practice is to construct a data center on a raised floor, and use a computer room air conditioner to force cold air through ducts below the floor and up through holes in the floor beneath or between the server racks. The cold air flows over the microprocessors and is heated, and the heated air can be drawn through ceiling ducts back to the computer room air conditioner.

SUMMARY

In one aspect, a facility is described that includes one or more enclosures defining an interior space, a plurality of power taps distributed with a substantially regular spacing in the interior space, a plurality of coolant supply taps distributed with a substantially regular spacing in the interior space, and a plurality of coolant return taps distributed with a substantially regular spacing in the interior space. A flow capacity of the supply taps and a flow capacity of the return taps are approximately equal over a local area of the interior space.

Implementations of the invention may include one or more of the following features. The supply taps and return taps may be connected to a heat exchanger or cooling plant. There need not be local storage or buffering of the coolant in the interior space. The plurality of power taps may be distributed with a substantially regular first spacing in a first direction and with a substantially regular second spacing in a second direction perpendicular to the first direction, the plurality of supply taps may be distributed with a substantially regular third spacing in the first direction and with a substantially regular fourth spacing in the second direction, and the plurality of return taps may be distributed with a substantially regular fifth spacing in the first direction and with a substantially regular sixth spacing in the second direction. The third spacing may be approximately equal to the fifth spacing and the fourth spacing is approximately equal to the sixth spacing. The first spacing may be a ratio N/M of the third spacing, where N and M are both whole numbers less than 5. The second spacing may be an integer N multiple (N) or fraction (1/N) of the fourth spacing, where N is less than five. The first spacing may be approximately equal to the third spacing and the second spacing may be approximately equal to the fourth spacing. The plurality of power taps may be laid along a plurality of first paths, the supply taps may be laid along a plurality of second paths, and the return taps may be laid along a plurality of third paths. The power taps may be disposed with substantially uniform spacing along the first paths, the supply taps may be disposed with substantially uniform spacing along the second paths, and the return taps may be disposed with substantially uniform spacing along the third paths. A spacing of the power taps along the first paths may be less than a spacing between adjacent first paths, a spacing of the supply taps along the second paths may be less than a spacing between adjacent second paths, and a spacing of the return taps along the third paths may be less than spacing between adjacent third paths. The first paths, second paths and third paths may be substantially are substantially linear. A plurality of power delivery busbars may provide power to the plurality of power taps, and the busbars may define the first paths. A plurality of coolant supply manifolds may provide coolant to the plurality of supply taps, and the coolant supply manifolds may define the second paths. A plurality of coolant return manifolds may return coolant from the return taps, and the coolant return manifolds may define the third paths. Each first path of the plurality of first paths may have an associated proximate second path of the plurality of second paths and an associated proximate third path from the plurality of third paths, and each first path may be spaced from the associated proximate second path by a substantially uniform first distance along a substantial length of the first path and each first path may be spaced from the associated proximate third path by a substantially uniform second distance along a substantial length of the first path. There may be a plurality of zones, each zone including a different set of two or more power taps from the plurality of power taps, a different set of two or more supply taps from the plurality of supply taps, and a different set of two or more return taps from the plurality of return taps. The two or more power taps of each zone may be configured to be controllably electrically coupled to a power source independently of the power taps of other zones. The two or more supply taps of each zone may be configured to be controllably fluidly coupled to a coolant source independently of the supply taps of other zones, and the two or more return taps of each zone may be configured to be controllably fluidly coupled to a coolant return independently of the return taps of other zones. The power taps may be spaced at a substantially uniform first density across the interior space, the coolant supply taps may be spaced at a substantially uniform second density across the interior space, and the coolant return taps may be spaced at spaced at a substantially uniform third density across the interior space. The second density may be approximately equal to the third density. Each supply tap may include a spigot, and each spigot may include a valve and a faucet. Each power tap may include a plurality of outlets.

In another aspect, a facility is described that includes one or more enclosures defining an interior space, a plurality of power taps distributed with a substantially regular spacing in the interior space, a plurality of coolant supply taps distributed with a substantially regular spacing in the interior space, and a plurality of coolant return taps distributed with a substantially regular spacing in the interior space. The plurality of power taps, the plurality of supply taps, and the plurality of return taps are divided into a plurality of zones, each zone including a different set of two or more power taps from the plurality of power taps, a different set of two or more supply taps from the plurality of supply taps, and a different set of two or more return taps from the plurality of return taps. The two or more power taps of each zone are configured to be controllably electrically coupled to a power source independently of the power taps of other zones and the two or more supply taps of each zone are configured to be controllably fluidly coupled to a coolant source independently of the supply taps of other zones, and wherein the two or more return taps of each zone are configured to be controllably fluidly coupled to a coolant return independently of the return taps of other zones.

Each zone may be a spatially contiguous area separate from other zones.

In another aspect, a facility is described that includes one or more enclosures defining an interior space, a plurality of power taps positioned along a plurality of first paths in the interior space, a plurality of coolant supply taps positioned along a plurality of second paths in the interior space, and a plurality of coolant return taps positioned along a plurality of third paths in the interior space. Each first path of the plurality of first paths has an associated proximate second path of the plurality of second paths and an associated proximate third path from the plurality of third paths, and wherein each first path is spaced from the associated proximate second path by a substantially uniform first distance along a substantial length of the first path and wherein each first path is spaced from the associated proximate third path by a substantially uniform second distance along a substantial length of the first path.

Implementations of the invention may include one or more of the following features. The power taps may be distributed with a substantially regular spacing, the supply taps may be distributed with a substantially regular spacing, and the return taps may be distributed with a substantially regular spacing. The supply taps and return taps may have the same spacing. A plurality of data taps may be distributed with a substantially regular spacing in the interior space. A plurality of data taps may be positioned along a plurality of fourth paths in the interior space, each first path of the plurality of first paths may have an associated proximate fourth path of the plurality of second paths, and each first path may be spaced from the associated proximate fourth path by a substantially uniform fourth distance along a substantial length of the first path. The power taps may be disposed with substantially uniform first spacing along the first paths, the supply taps may be disposed with substantially uniform second spacing along the second paths, and the return taps may be disposed with substantially uniform third spacing along the third paths. A spacing of the power taps along the first paths may be less than a spacing between adjacent first paths, a spacing of the supply taps along the second paths may be less than a spacing between adjacent second paths, and a spacing of the return taps along the third paths may be less than spacing between adjacent third paths. The first paths, second paths and third paths may be substantially are substantially linear. The second paths and the third paths may be uniformly spaced with a first pitch. The second paths may be immediately adjacent to the third paths. Adjacent second paths and third paths may be separated by one-half of the first pitch. The first paths may be uniformly spaced with a second pitch. The second pitch may be an integer N multiple (N) or fraction (1/N) of the first pitch, where N is less than five. The second pitch may be equal to the first pitch. The second paths and third paths may be arranged substantially parallel to the first paths. The first spacing may be a ratio N/M of the second spacing, where N and M are both whole numbers less than 5. The second spacing may be approximately equal to the third spacing. A plurality of power delivery busbars may provide power to the plurality of power taps and the busbars may define the first paths, a plurality of coolant supply manifolds may provide coolant to the plurality of supply taps and the coolant supply manifolds may define the second paths, and a plurality of coolant return manifolds may return coolant from the return taps and the coolant return manifolds may define the third paths. Each supply tap may include a spigot, and each spigot may include a valve and a faucet. Each power tap may include a plurality of power outlets. A flow capacity of the supply taps and a flow capacity of the return taps may be approximately equal over a local area of the interior space. There may be no local storage or buffering of the coolant. The plurality of supply taps and the plurality of return taps may be connected to a heat exchanger or cooling plant. A plurality of cooling coils may remove heat from air near the rack-mounted computers, and the cooling coils may be fluidly connected between the supply taps and the return taps.

Each facility may have an associated method of building the facility including building one or more enclosures, placing power taps, placing coolant supply taps and placing coolant return taps.

In another aspect, a data center is described. The data center includes one or more enclosures defining an interior space, a plurality of power taps distributed with a substantially regular spacing in the interior space, a plurality of coolant supply taps distributed with a substantially regular spacing in the interior space, a plurality of coolant return taps distributed with a substantially regular spacing in the interior space, and a plurality of modules. Each module includes a plurality of rack-mounted computers connected to a power tap adjacent the module and a cooling coil to remove heat from air near the rack-mounted computers, the cooling coil fluidly connected between a supply tap and a return tap adjacent the module.

Implementations can include one or more of the following. A plurality of power lines may have the plurality of power taps, a plurality of coolant supply lines may have the plurality of coolant supply taps, and a plurality of coolant return lines may have the plurality of coolant return taps. The power lines, coolant supply lines and coolant return lines may be substantially linear. The modules may be arranged in substantially linear rows. The linear rows of module may be perpendicular or parallel to the power lines. There may be a power line for each module in a row of the modules or for each row of modules. The linear rows of modules may be perpendicular or parallel to the coolant supply lines and the coolant return lines. There may be a coolant supply line and a coolant return line for each row or every two rows of modules. The power lines may be positioned above of the modules, and the coolant supply lines and the coolant return lines may be positioned below the modules. Each module may be connected to a coolant supply tap on one side of the module and to a coolant return tap on an opposite side of the module, or each module may be connected to a coolant supply tap and to a coolant return tap on the same side of the module. A flow capacity of the supply taps and a flow capacity of the return taps may be approximately equal over a local area of the interior space. The plurality of power taps may be distributed with a substantially regular first spacing in a first direction and with a substantially regular second spacing in a second direction perpendicular to the first direction, the plurality of supply taps may be distributed with a substantially regular third spacing in the first direction and with a substantially regular fourth spacing in the second direction, and the plurality of return taps may be distributed with a substantially regular fifth spacing in the first direction and with a substantially regular sixth spacing in the second direction. The third spacing may be approximately equal to the fifth spacing and the fourth spacing may be approximately equal to the sixth spacing.

In another aspect, a data center is described. The data center includes one or more enclosures defining an interior space, a plurality of power lines, a plurality of coolant supply lines, a plurality of coolant return lines, and a plurality of clusters of modules in the interior space. Each of the power lines includes a plurality of power taps in the interior space, each of the coolant supply lines includes a plurality of coolant supply taps in the interior space, and each of the coolant return lines includes a plurality of coolant return taps in the interior space. Each cluster is located in a spatially contiguous area separate from other clusters, each module includes a plurality of rack-mounted computers connected to a power tap adjacent the module and a cooling coil to remove heat from air near the rack-mounted computers, the cooling coil fluidly connected between a supply tap and a return tap adjacent the module. Each cluster includes two or more modules, and each of the two or more modules is connected to different ones of the plurality of power lines or different ones of the plurality of coolant supply lines and the plurality of coolant return lines.

Implementations may include one or more of the following. Each of the two or more modules may be connected to different ones of the plurality of power lines. Each of the two or more modules may be connected to different ones of the plurality of coolant supply lines and the plurality of coolant return lines. Each of the two or more modules may be connected to different ones of the plurality of power lines and different ones of the plurality of coolant supply lines and the plurality of coolant return lines. Substantially all of the rack-mounted computers of a particular cluster may be dedicated to the same application. The rack-mounted computers of at least two different clusters of the plurality of clusters may be dedicated to different applications. The plurality of power taps may be distributed with a substantially regular spacing in the interior space, the plurality of coolant supply taps may be distributed with a substantially regular spacing in the interior space, and the plurality of coolant return taps may be distributed with a substantially regular spacing in the interior space. The power lines, coolant supply lines and coolant return lines may be substantially linear. The modules may be arranged in substantially linear rows. The linear rows of the modules may be perpendicular to the power lines. The linear rows of the modules may be parallel to the coolant supply lines and the coolant return lines. The power lines may be uniformly spaced. The power lines may be spaced with a pitch approximately equal to a spacing between modules in the rows. The linear rows of the modules may be perpendicular to the coolant supply lines and the coolant return lines. The linear rows of the modules may be parallel to the power lines. The linear rows of the modules may be perpendicular to the power lines, the coolant supply lines and the coolant return lines. The rows of modules may be separated by access aisles. At least two of the coolant supply lines and at least two of the coolant return lines may be connected to different cooling plants. The power taps may be disposed with substantially uniform first spacing along the power lines, the supply taps at may be disposed with substantially uniform second spacing along the coolant supply lines, and the return taps may be disposed with substantially uniform third spacing along the coolant return lines. The second spacing may be approximately equal to the third spacing. The coolant supply lines and the coolant return lines may be uniformly spaced with a first pitch. The modules may be distributed with a substantially regular spacing in the interior space.

In another aspect, a method of operating a data center is described. The method includes supplying power to rack-mounted computers in a row of racks from a plurality of power taps extending along the row, supplying coolant to coolant coils in a space adjacent the racks from a plurality of supply taps of a coolant supply manifold extending along the row, and directing warmed coolant from the coolant coils through a plurality of return taps of a coolant return manifold extending along the row.

Implementations of the invention may include one or more of the following. Heat may be removed from the warmed coolant and returning the coolant to the coolant supply manifold. The servers may be located in an interior space, the power taps may be spaced at a substantially uniform first density across the interior space, the supply taps may be spaced at a substantially uniform second density across the interior space, and the return taps may be spaced at spaced at a substantially uniform third density across the interior space.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 3A and 3B are sectional and top views of an exemplary computing module.

Like reference symbols in the various drawings indicate like elements.

DETAILED DESCRIPTION

One issue with using computer room air conditioners for cooling a data center is efficiency. Since air has a low heat capacity, it would be more efficient to place the coolant (e.g., water) closer to the microprocessors. One example of such a technique is to place cooling coils on the sides of a server rack or group of server racks. Such a technique is described by U.S. Patent Application Ser. No. 60/810,452, filed Jun. 1, 2006, the entire disclosure of which is incorporated by reference.

Another issue with any data center is time in bringing a data center into operation; the faster a data center can begin operating the sooner it can generate revenue. Moreover, if a portion of a data center, e.g., one or more server racks, could be brought into operation while other server racks in the data center are still being installed, this would provide significant flexibility in construction and operation while permitting the portion that is operating to meet data processing needs. This issue is exasperated with computer room air conditioners; not only is a facility generally not suitable for installation of server racks until the entire air conditioning system is installed, but if only a portion of the data center is operating then the air conditioning unit must cool the entire room rather than just the operating portion.

Figure 1A:
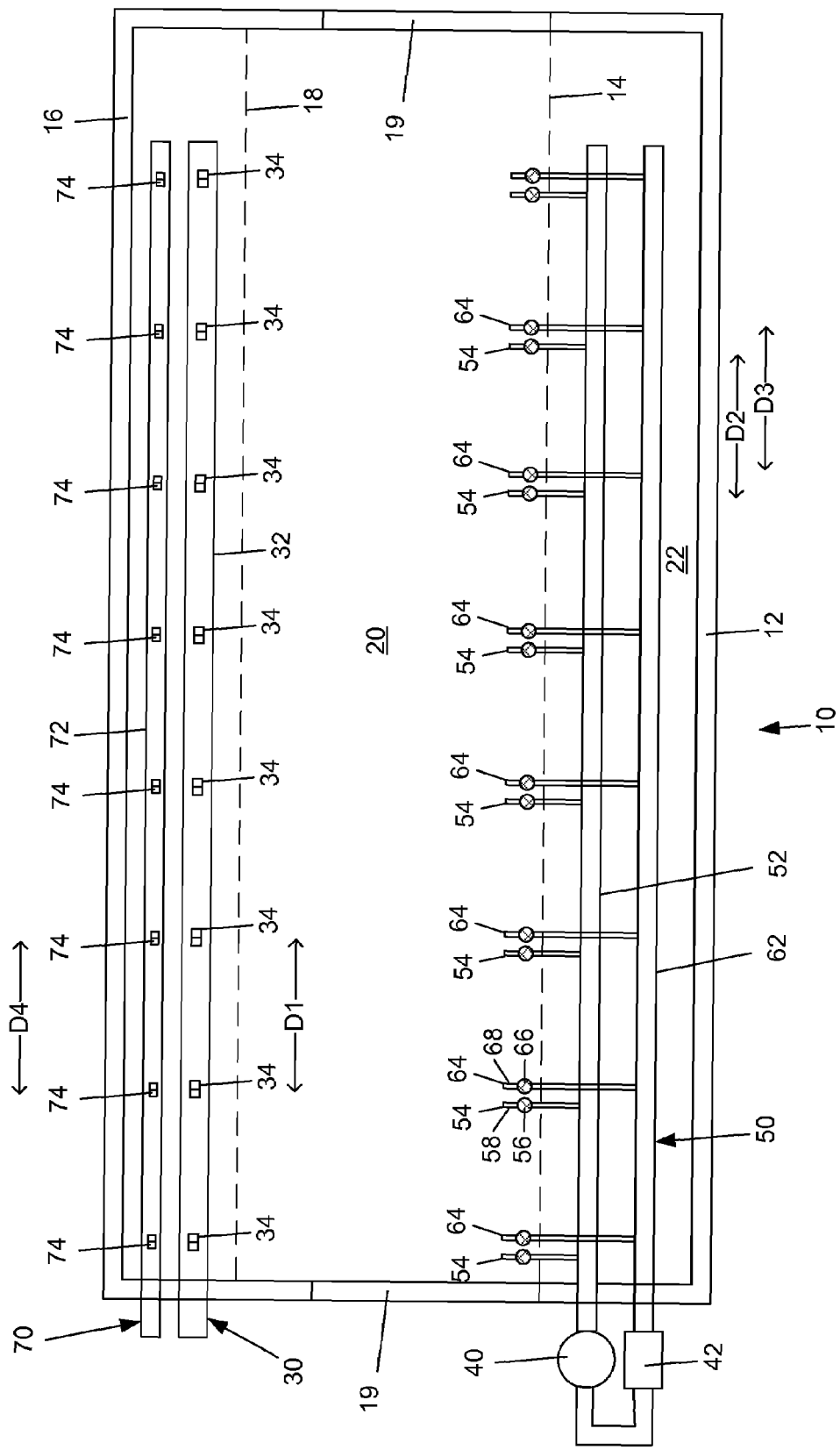
FIGS. 1A and 1B are sectional and plan views, respectively, of a facility with cooling and power grids.
Figure 1B:
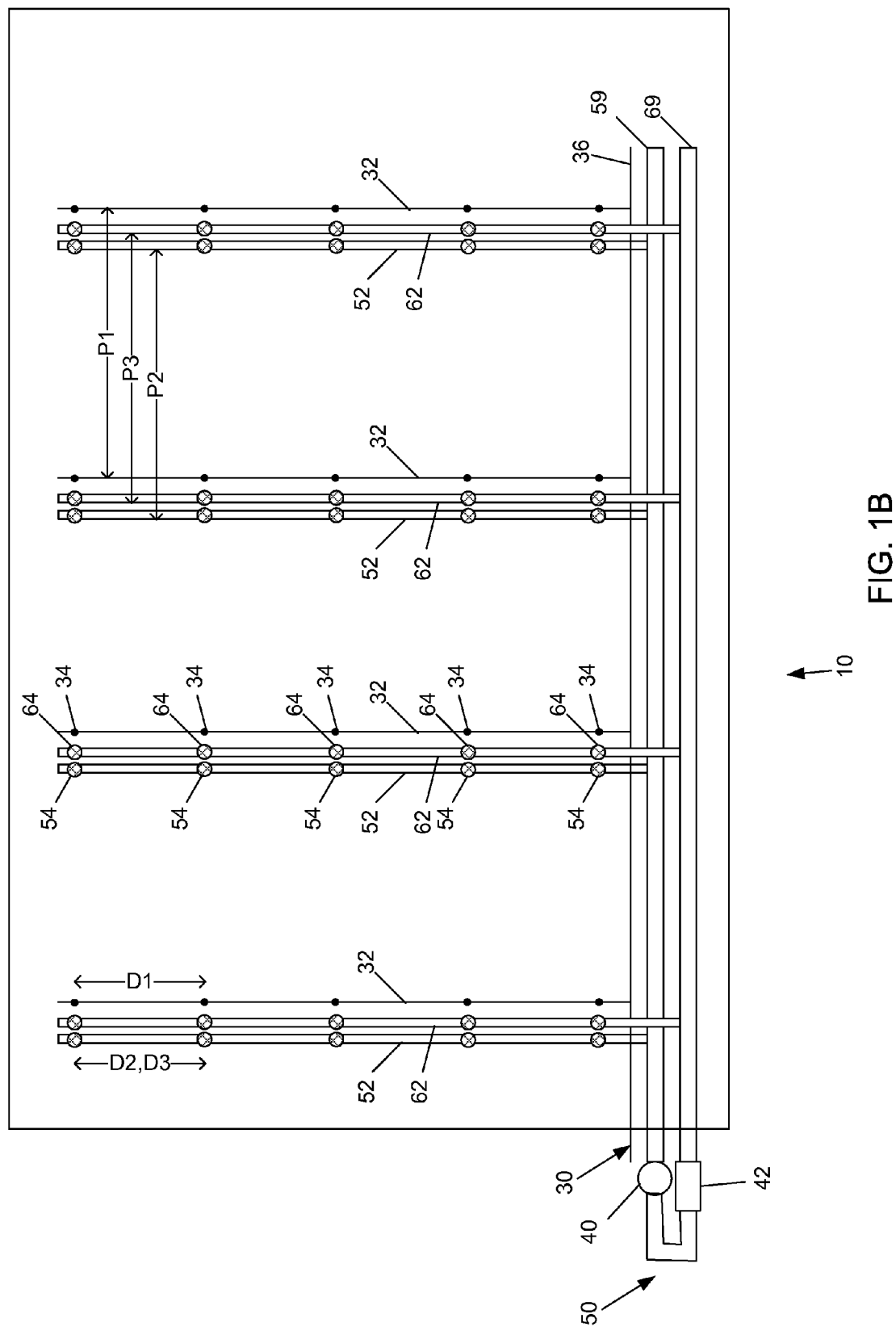

FIG. 1A shows a side sectional view of a facility 10 with a power grid 30, a cooling grid 50 and a "data grid" 70, before installation of the computers and other components of the data center. FIG. 1B shows a plan view of the facility 10 with the power grid 30, cooling grid 50 and "data grid" 70. The facility 10 is an enclosed space and can occupy essentially an entire building, or be one or more rooms within a building. The facility 10 can include a floor 12 (e.g., a concrete slab or a metal sheeting laid over steel beams), a raised floor 14 supported on the floor 12, a ceiling 16 (which could be the floor of another level of the building) and a suspended ceiling 18 hung from support beams or the ceiling 16. Doors 19 can be formed in the walls of the facility. Between the raised floor 14 and the suspended ceiling 18 is an enclosed space 20 sufficiently large for installation of numerous (dozens or hundreds or thousands of) server racks.

As shown in FIGS. 1A and 1B, the power grid 30 includes a distributed set of power "taps" 34, e.g., outlets or receptacles, e.g., sockets. The power taps can be distributed in a line or array of regularly spaced power taps. In operation, the power grid 30 is connected to a power supply, e.g., a generator or an electric utility, and supplies conventional commercial AC electrical power, e.g., 120 or 208 Volt, 60 Hz (for the United States). The receptacles can be conventional commercial power recepticles, e.g., Type B (American 3-pin) (again, for the United States). The outlets can be flush or recessed in the suspended ceiling 18, or the outlets can hang below the suspended ceiling 18. The amperage capacity of the busbar 32 can be selected during installation to exceed the expected draw, which can be calculated based on the maximum number of server cabinets that could draw power from that busbar.

As shown in FIG. 1B, the power grid can include power distribution "lines" 32, such as busbars 32 suspended on or from the ceiling 18. Each busbar 32 includes the power taps 34, e.g., the outlets or receptacles. Alternatively, busbars could be replaced by groups of outlets independently wired back to the power supply, e.g., elongated plug strips or receptacles connected to the power supply by electrical whips. Optionally, a group of taps, e.g., the taps along a particular line 32, can be connected by a common switch or circuit breaker to the power supply so that power can be shut off to the line of taps as a group.

The power taps 34 have a regular spacing, e.g., a regularly repeating pattern of spacing, such as at regular intervals with a spacing D1, along the busbar 32. Each power tap 34 can include a cluster of electrical outlets, e.g., six to twelve outlets, held in an single frame. The power tap 34 can include more than twelve outlets, or as few as a single outlet.

As shown in FIG. 1B, the power grid 30 can include multiple power supply lines, e.g., busbars 32, spaced evenly across the facility area with a pitch P1. Thus, the power "taps" 34 can be distributed uniformly across the space of the facility. The busbars 32 can be connected to a common electrical supply line 36, which in turn can be connected to the power supply.

Figure 2A:
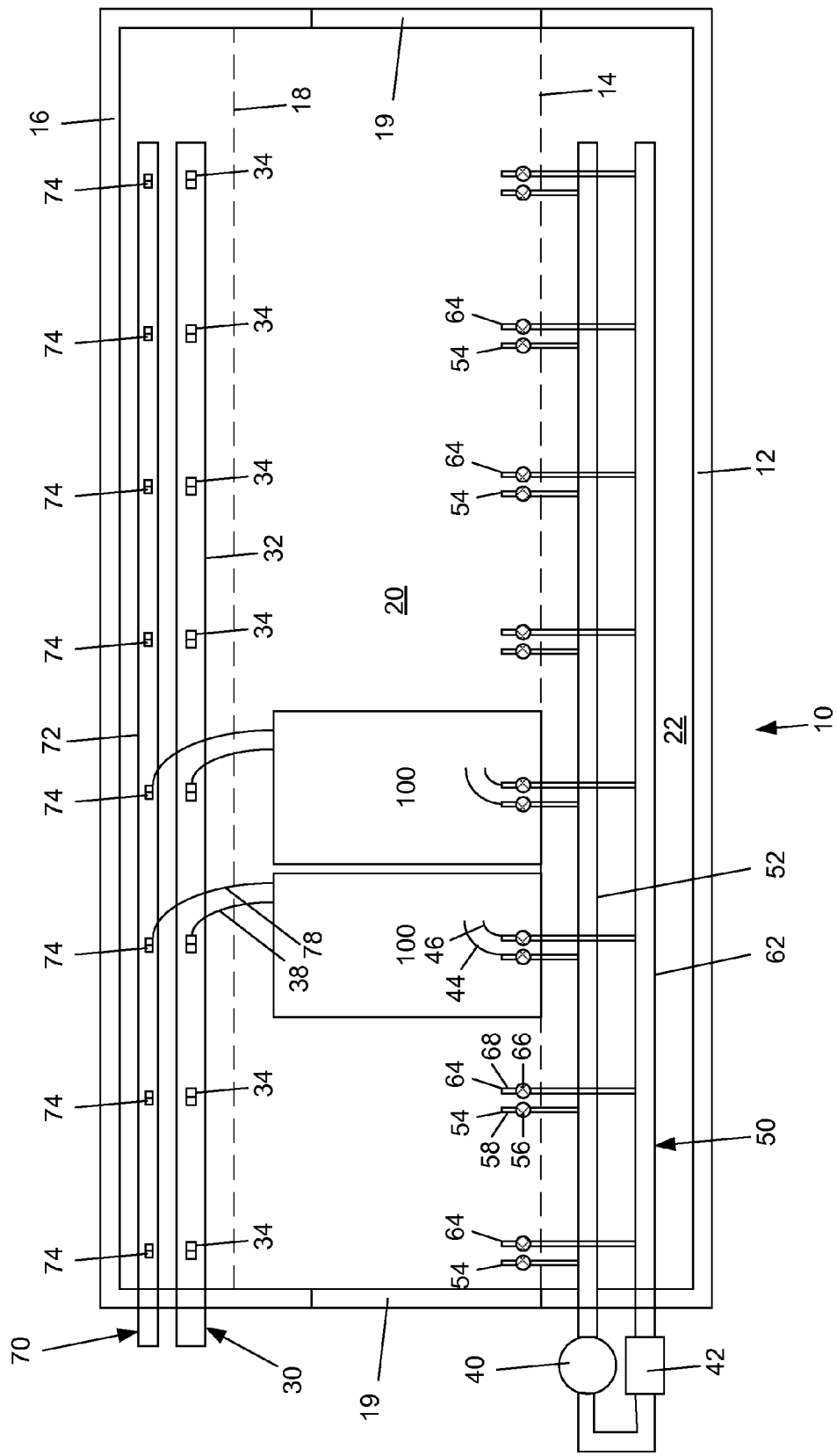
FIGS. 2A and 2B are sectional and plan views of the facility of FIGS. 1A-1B operating as a data center.
Figure 2B:
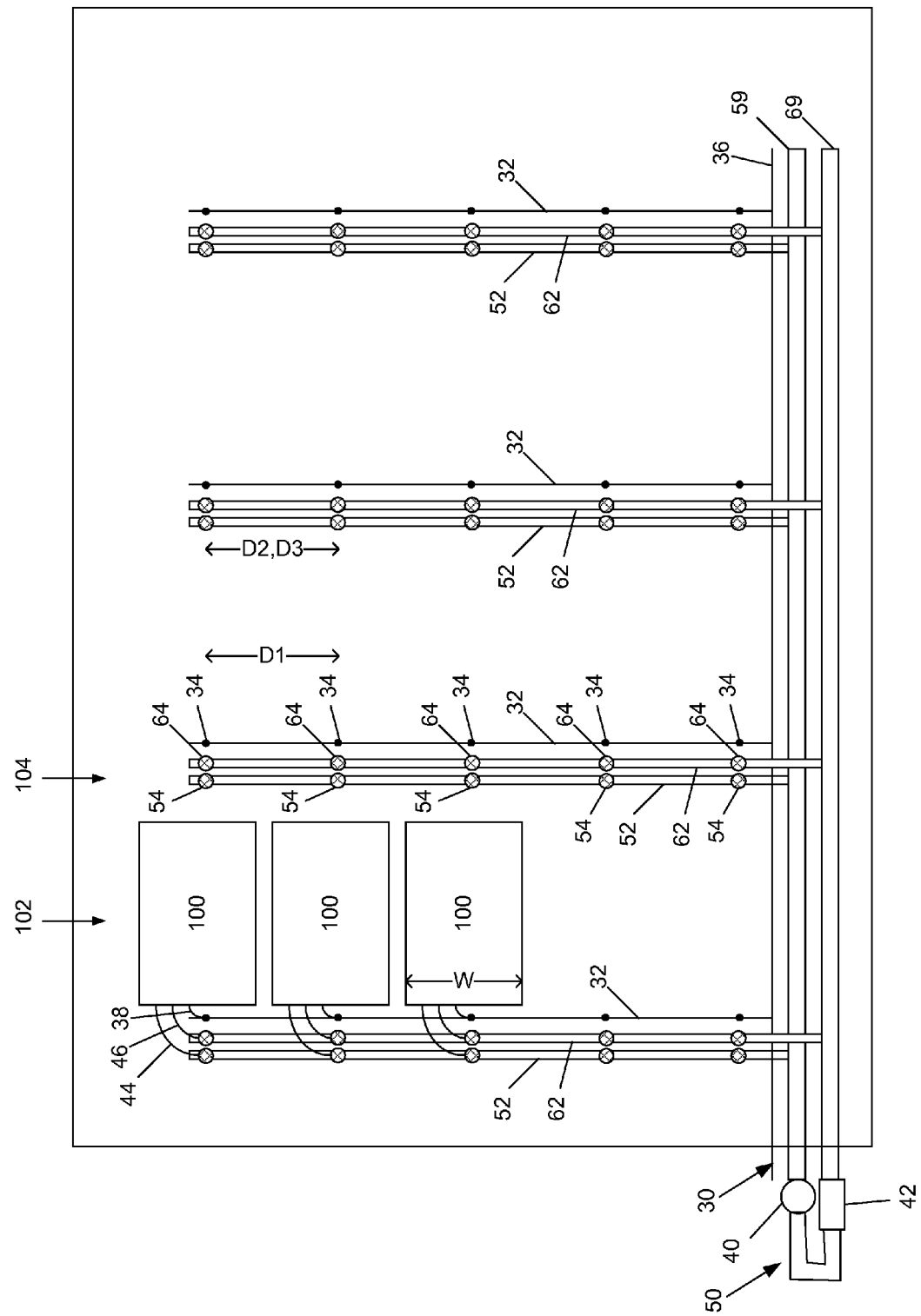

FIGS. 2A and 2B show sectional and plan views of the facility 10 with several modules 100 of rack-mounted computers installed. The modules 100 are arranged in rows 102 separated by access aisles 104. Each module 100 can include multiple racks, and each rack can include multiple trays. The busbars 32 can extend parallel to the row of modules.

As shown, each module 100 is connected to an adjacent power tap 34, e.g., by power cabling 38. Assuming that the busbars 32 do run parallel to a row of modules, the spacing D1 can be equal to or less than the width of a module that is expected to be installed. For example, the spacing D1 can be about two to six feet. Alternatively, the spacing can be greater than the width W of the module (although probably not more than two or three times the width of a module), in which case the number of outlets can be increased proportionally. The pitch P1 can be about equal to the pitch between the rows of modules, e.g., six to twelve feet.

Although FIGS. 2A and 2B illustrate the rows of modules 100 as adjacent the busbars 32, the rows of modules could be directly beneath the busbars. In addition, the busbars 32 need not be suspended from the ceiling, but can run through the plenum 22 between the floor 12 and the raised floor 14.

Returning to FIG. 1A, the cooling grid 50 includes a coolant, e.g., water, supply manifold 52 and a coolant return manifold 62 which run through the plenum 22 between the floor 12 and the raised floor 14. Although this specification describes water supply and return manifolds, other cooling fluids or refrigerants could be used. The water supply manifold 52 includes supply "taps" 54, e.g., water spigots, each having a valve 56 and an outlet 58 that is threaded or otherwise configured, e.g., with a threadless quick-disconnect type fitting, for fastening a hose or pipe. The water supply taps 54 have a regular spacing, e.g., a regularly repeating pattern of spacing, such as at regular intervals with a distance D2, along the supply manifold 52. Similarly, the water return manifold 62 includes return "taps" 64, each having a valve 66 and an inlet 68 that is threaded or otherwise configured for fastening a hose or pipe (these water inlets can be constructed similarly to conventional spigots, but are for water return rather than supply). The water return taps have a regular spacing, e.g., a regularly repeating pattern of spacing, such as at regular intervals with a distance D3, along the return manifold 62. Each supply "tap" 54 can include a single spigot or a cluster of spigots, and similarly each return tap 64 can include a single inlet or a cluster of inlets. The spigots and inlets can project above the raised floor 14, or be flush with or recessed in the floor 14. In some implementations, the spacing D2 of the water supply taps 54 is the same as the spacing D3 of the water return taps 64.

The flow capacity of the supply and return manifolds 52/62 can be selected during installation to exceed the expected draw, which can be calculated based on the maximum power available for server cabinets that could draw water from or return water to that manifold. The manifold can be 4-inch or 6-inch diameter piping, e.g., PVC or steel pipe.

The water supply and return manifolds 52 and 62 are connected by a pump 40 and a heat exchanger or cooling plant 42, which can be located outside the space that actually holds the rack-mounted computers but within or adjacent the same building. The flow capacity of the supply and return manifolds 52 and 62, the flow capacity of the pump 40 and the capacity of the heat exchanger 42 can be selected before installation for the expected heat based on the power available in the associated busbars.

As shown in FIG. 1B, the cooling grid 50 can include multiple water supply and return manifolds 52 and 62, spaced evenly across the facility area with a pitch P2 and P3 respectively. Thus, the water supply and return "taps" 54 and 64 can be distributed uniformly across the space of the facility. The supply manifolds 52 can be connected to a common water supply line 59, and the return manifolds 62 can be connected to a common water return line 69, and the water supply line 59 and water return line 69 can in turn can be connected to the pump 40 and a heat exchanger or cooling plant 42. A valve can couple each supply manifold 52 and return manifold 62 to the water supply line 59 and water return line 69 so that coolant flow can be shut off to a line of taps (and the associated line of server racks) as a group.

In some implementations, the pitch P2 of the water supply manifolds 52 can be the same as the pitch P3 of the water return manifolds 62. In some implementations, the density of the water return taps 64 (e.g., per unit length of the water return manifold) times the flow capacity per water return tap can be equal to the density of the water supply taps 54 (e.g., per unit length of the water supply manifold) times the flow capacity per water supply tap. The flow capacity per water tap can be adjusted by modulating valves, selecting the number spigots or inlets per tap. In general, the supply and return flow is matched on a local basis (e.g., over several modules) so that there is no local storage or buffering of the water. In some implementations, each water supply tap 54 can be located adjacent a water return tap 64.

Although FIGS. 2A and 2B illustrate the rows of modules 100 as adjacent the water supply and water return manifolds 52 and 62, the rows of modules 100 could be directly above the manifolds. In addition, the manifolds need not run through the plenum 22, but could be suspended from the ceiling.

As shown, each module 100 is connected to an adjacent water supply tap 54 and water return tap 64, e.g., by flexible hoses 44 and 46, respectively. Assuming that the manifolds run parallel to a row of modules, the spacing D2 and D3 can be equal to or less than the width of a module that is expected to be installed. For example, the spacings D2 and D3 can be about four to six feet. If the spacing D2 or D3 is greater than the width of the modules, then the number of spigots or inlets would need to be increased. The pitch P2 and P3 can be about equal to the pitch between the lines of server racks, e.g., four to twelve feet.

Generally, the spacing D1 is related to the spacing D2 and D3, and the pitch P1 is related to the pitch P2 and P3. In a simple implementation as shown in FIGS. 1A-2B, the pitches P2 and P3 of the manifolds of the cooling grid are equal the pitch P1 of the busbars of the power grid. In addition, the spacings D2 and D3 of the cooling grid taps are equal to the spacing D1 of the power taps. For example, the cooling grid taps can be spaced 2 feet apart, whereas the power grid taps can have a spacing of 600 millimeters.

Returning to FIG. 1A, the "data grid" 70 (the data grid is not shown in FIG. 1B due to lack of space) includes data cabling 72 and data "taps" 74, e.g., data outlets, for connection to the rack-mounted computers. The cabling can be conventional Cat-5 or Cat-6 or CX-4 or optical cabling, and the data outlets can be conventional modular receptacles. Each data tap 74 can include a cluster of data outlets, e.g., 180 outlets. The data taps 74 have a regular spacing, e.g., a regularly repeating pattern of spacing, such as at regular intervals with a distance D4, along the string of cabling 72. The data cabling 72 can be suspended from the ceiling as shown or run through the plenum 22 between the floor 12 and the raised floor 14. Alternatively, data cabling could run directly to the rack-mounted computers without an intervening receptacle. Groups of cables, e.g., the data cables from a rack of rack-mounted computers, a row of racks, or a line of computer modules, can be connected to an intervening switch or patch board.

The data grid 70 can include multiple cabling bundles 72, spaced evenly across the facility area with a pitch P4 (not shown). Thus, the data "taps" 74 can be distributed uniformly across the space of the facility.

As shown in FIG. 2A, each rack-mount module 100 is connected to an adjacent data tap 74 by data cabling 78, e.g., by additional Cat-5 or Cat-6 cabling. The data cabling 72 can extend parallel to the row of modules. Assuming that the data cables 72 run parallel to a row of modules, the spacing D4 can be equal to or less than the width of a module that is expected to be installed. For example, the spacing D4 can be about four to six feet. Alternatively, the spacing can be greater than the width of the module, in which case the number of data receptacles can be increased proportionally.

The spacing D4 can be related to the spacing D1, D2 and D3, and the pitch P4 can be related to the pitch P1, P2 and P3. In a simple implementation as shown in FIGS. 1A-2B, the pitches P4 of the data cabling 72 is equal to the pitch P1 of the busbars of the power grid and the spacing D4 of the data taps is equal to the spacing D1 of the power taps.

In general, the rows of modules 100 extend along the same path, e.g., are linear and parallel to, the busbars 32, water supply manifolds 52 and water return manifolds 62. In the implementation illustrated in FIGS. 1A-2B, there is one row of modules 100 per busbar 32, water supply manifold 52 and water return manifold 62. However, as discussed below, many other layouts are possible.

In some implementations, the rack-mounted computers are grouped (e.g., a group can be the computers in the modules along a particular path, such as a row of modules), and the power and coolant flow can be independently shut on and off for each group, e.g., power and coolant can be shut off for one row of modules so that the computers in that group are disabled, while power and coolant continue to flow and the computers continue to operate in another row of modules. However, in some layouts, it may be possible to shut off coolant to a group of modules (e.g., multiple rows), whereas power can be shut off independently to sub-groups within the group (e.g., individual rows).

FIGS. 3A and 3B are side and top views of a rack-mount computer module 100 that can be installed in the facility. The module 100 includes two parallel rows 110 of racks 120 separated by a space 112. Each row 110 in the module 100 can include several, for example, two to five, e.g., three, racks 120 placed side-by side. Each rack 120 can include several dozen vertically stacked trays 122, with approximately several inches between each tray. The term "tray" is not intended to refer to a particular form factor, but refers to any arrangement of computer-related components coupled together so as to be removable from the rack as a unit. Moreover, the term "computer module" or "rack-mounted computer" includes not just rack-mounted computers, e.g., servers, but also racks of other communications and data processing equipment, such as network gear, e.g., switches and routers.

In general, each tray 122 can include a circuit board, such as a motherboard, on which a variety of computer-related components are mounted. Trays can be implemented for particular functional purposes, such as computer servers (whether for electronic mail, search requests, or other purposes), network gear (such as switches or routers), data storage (with a drive or group of drives). A given rack can include trays dedicated to a single function, or a rack can include a mix of trays with different functions. In general, trays in a data center have a standardized physical and power-coupling form so as to be easily interchangeable from one location in the data center to another (e.g., from one slot on a rack to another slot or from one rack to another rack). Trays for a given functional purpose can also have a standardized form for the physical layer of their input/output interface. For operation, each circuit board will be connected both to the power grid, e.g., by wiring that first runs through the rack itself and which is further connected by power cabling to a nearby power tap 34, and to the data grid, e.g., by data cabling that is connected to a nearby data tap 74.

Cooling coils 130 are located in the space 112 between the rows 110 of racks 120. For operation, one end of the cooling coil 130 is connected, e.g., by a flexible hose 44, to a nearby water supply tap 54 and the other end of the cooling coil 130 is connected, e.g., by a flexible hose 46, to a nearby water return tap 56. In addition, fans 132 can be placed on the walls of the racks and above the space and be powered by the busbar.

In operation, cool water will be pumped through the supply manifolds and into the cooling coil 130 via the taps 54. The fans 132 will draw air across the trays 122 into the space 112, thereby removing heat from the microprocessors in the trays. This warmed air is drawn through the cooling coils 130 and directed up through the top of the space 112. The cooling coils 130 transfer heat from the air passing through the space 112 to the water in the coils, and the warmed water is drawn through the return taps 56 and return manifolds back to the heat exchanger or cooling plant 42.

Figure 4:
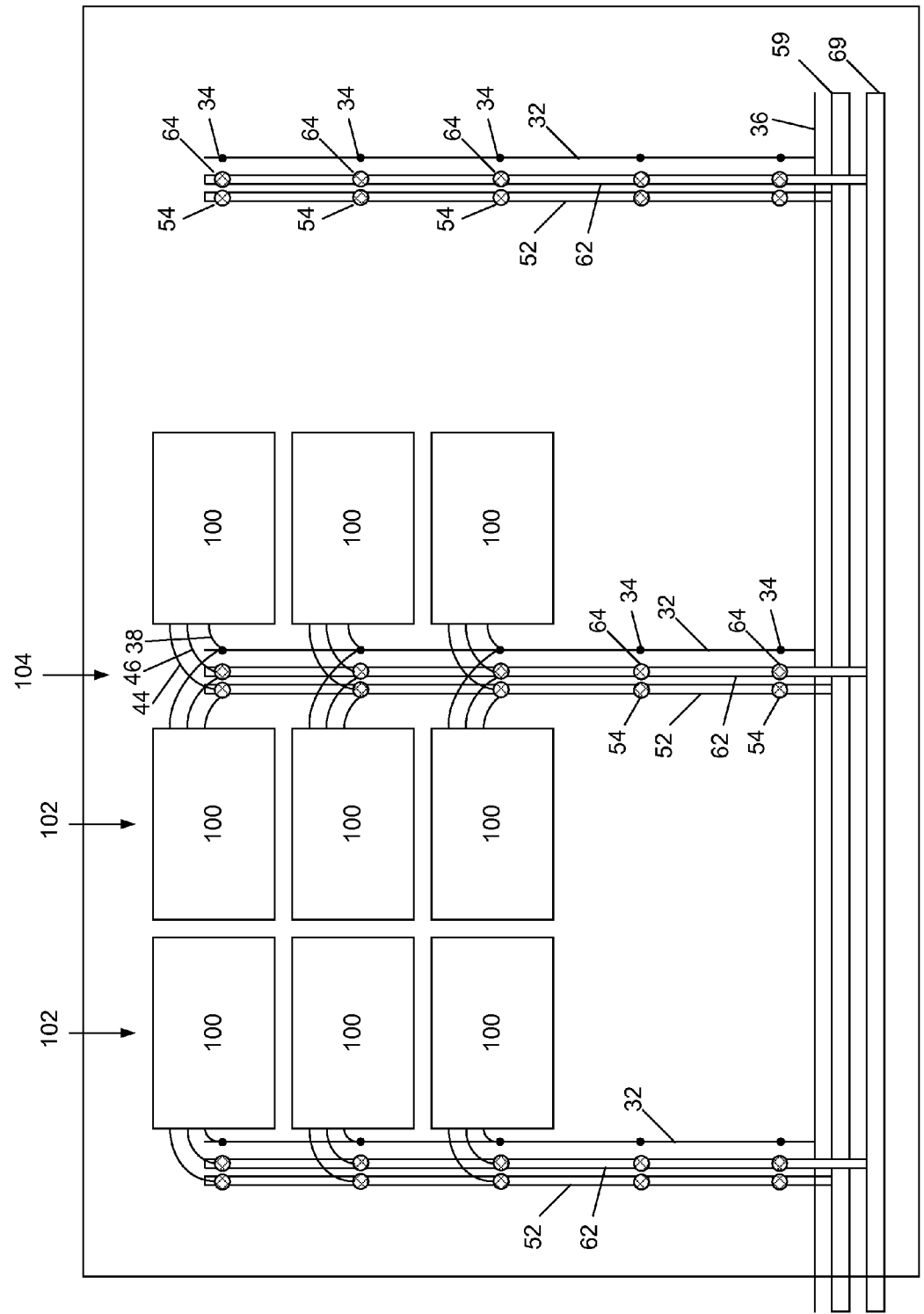
FIGS. 4-13 are plan views of other implementations of a facility with cooling and power grids operating as a data center.

FIG. 4 is a plan view of an implementation of a facility with a cooling and power grids and operating as a data center with two rows of modules 100 per busbar 32, water supply manifold 52 and water return manifold 62. Each module 100 is connected to an immediately adjacent grid. Thus, at least some of the busbars 32, water supply manifolds 52 and water return manifolds 62 are connected to rows of modules 100 on opposite sides. This permits the water supply and return manifolds 52 and 62 to be placed beneath the flooring of the aisles 104 separating the modules 100 where the manifolds can be more easily serviced. Although some of the modules are illustrated as adjacent, if the modules have racks on opposite sides, then the modules would need to be spaced apart to provide an aisle for personnel access.

Figure 5:
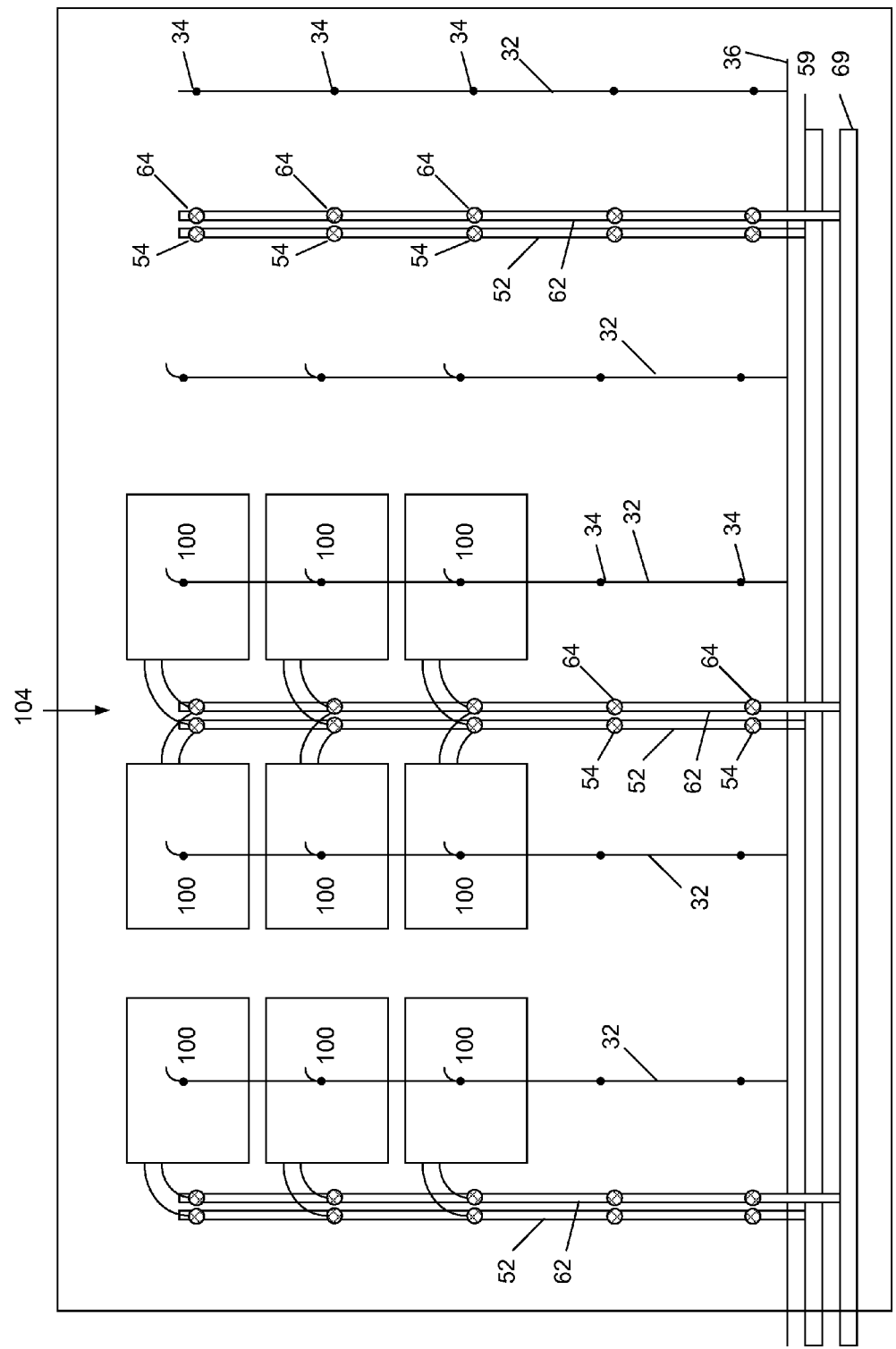

The implementation shown in FIG. 5 is similar to FIG. 4, but a power busbar 32 is disposed over each row of modules 100. Thus, in this layout, the pitches P2 and P3 are two times greater than pitch P1 and are offset from pitch P1 by about P1/2.

Figure 6:
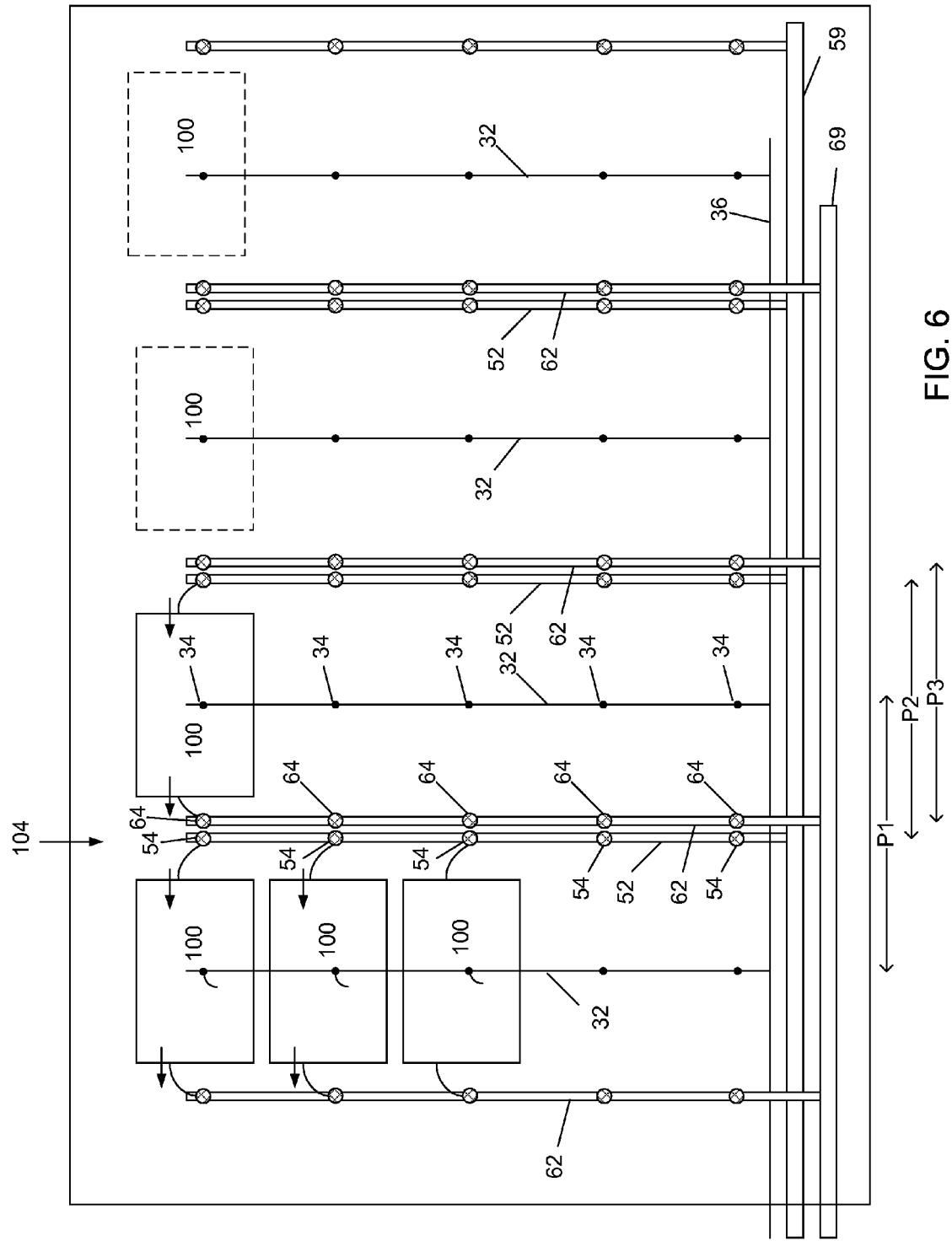

FIG. 6 is a plan view of another implementation of a facility with cooling and power grids and operating as a data center. As shown, the spacings D1, D2 and D3 are equal and the pitches P1, P2 and P3 are equal, but the power busbars 32 are spaced a half-pitch P1 or P2 from the water supply and return manifolds 52 and 62. In addition, each module 100 can be connected to a supply manifold 52 and a return manifold 62 that are located on opposite sides of the module. Thus, in this layout, the supply manifold 52 and return manifolds are offset by substantially an entire pitch P1 or P2. This configuration permits the busbars 32 to run directly over the modules 100, but water supply and return manifolds 52 and 62 can be placed beneath the flooring of the aisles 104 separating the modules 100 where the manifolds can be more easily serviced. In addition, if any manifold has to be shut down, then only the single row of computers components serviced by that manifold would also need to be shut down.

Figure 7:
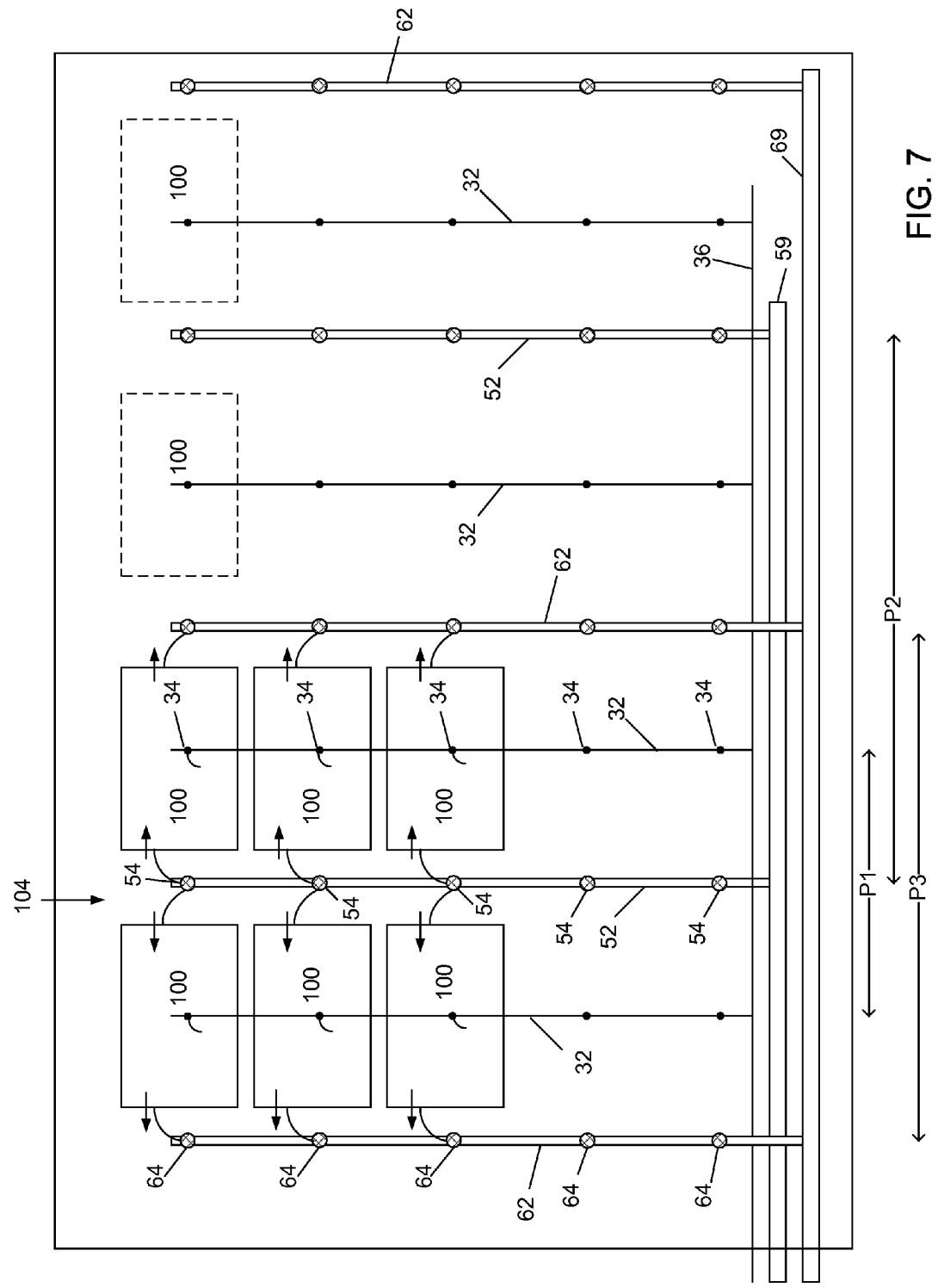

FIG. 7 is a plan view of another implementation of a facility with cooling and power grids and operating as a data center. As shown, rather than having immediately adjacent water supply and return manifolds 52 and 62, each water supply manifold 52 is separated from the nearest water return manifold 62 by a row of modules 100. Thus, the pitches P2 and P3 are two times greater than pitch P1. The spacings D1, D2 and D3 can be equal, but the minimum number of spigots and inlets at each tap (excepting those along the edges of the room) would be twice the minimum number for the implementations shown in FIG. 5. This reduces the amount of installed pipe and thus can reduce construction cost and time, but if any manifold has to be shut down then two rows of modules will be also need to be shut down.

Figure 8:
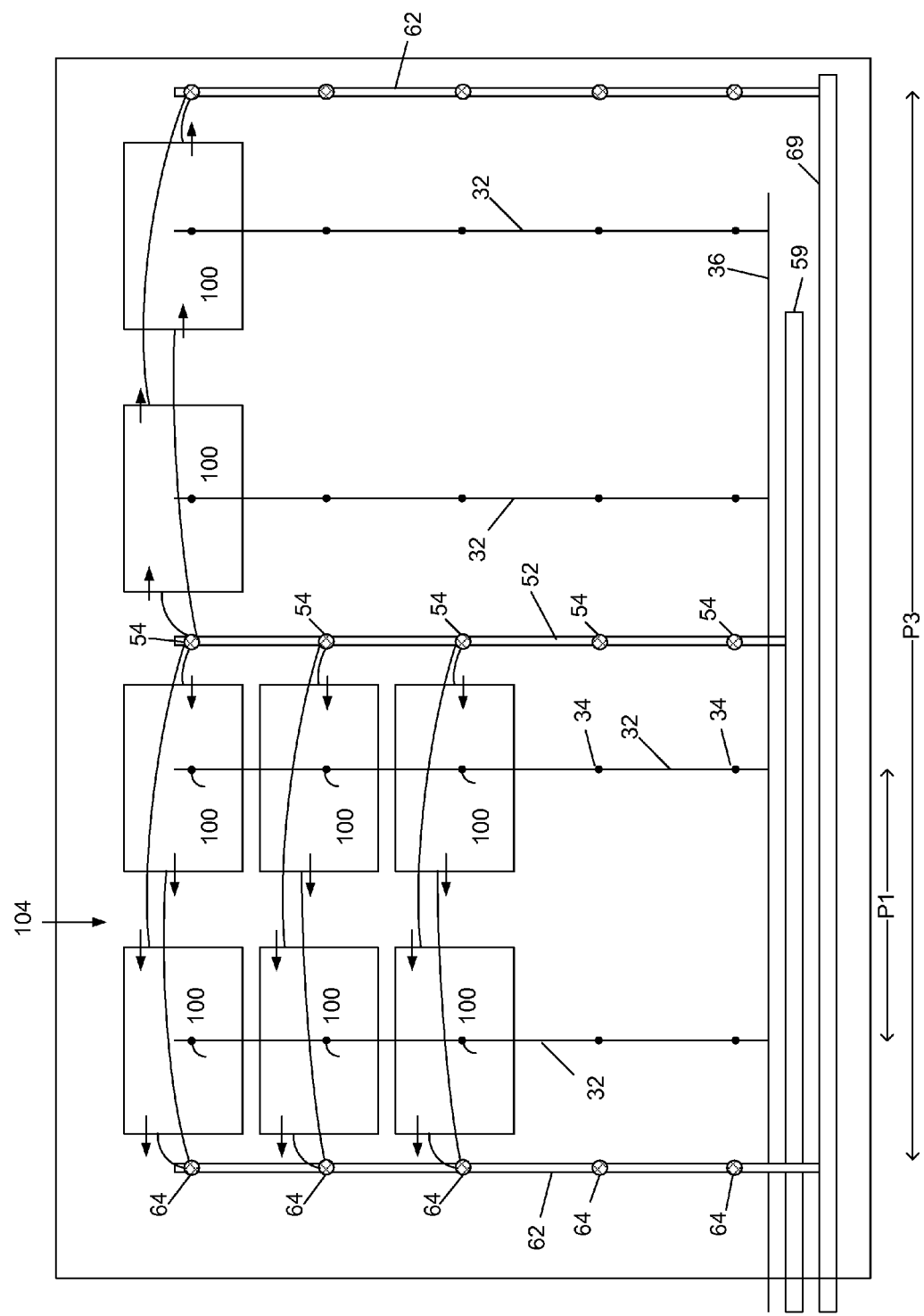

FIG. 8 is a plan view of another implementation of a facility with a cooling and power grids operating as a data center. In this implementation, each pair of water supply and return manifolds 52 and 62 is separated by multiple rows, e.g., four or fewer rows, of modules 100. Thus, the pitches P2 and P3 are two or more times greater than pitch P1 (only one supply manifold is shown in FIG. 8 due to space limitations, and thus pitch P2 is not illustrated). The spacings D1, D2 and D3 can be equal, but the minimum number of spigots and inlets at each tap would be two or more the minimum number for the implementations shown in FIG. 7. Although this uses longer hoses than the implementation shown in FIG. 7, it reduces the amount of installed pipe and thus reduces construction cost and time. Of course, the features of FIGS. 4 and 5 could be combined with each water supply manifold 52 separated from the nearest water return manifold 62 by multiple rows of modules 100. In addition to or instead of the water supply and return manifolds being separated by multiple rows of modules, the electrical busbars 32 could be separated by multiple rows, e.g., four or fewer rows, of modules 100.

Figure 9:
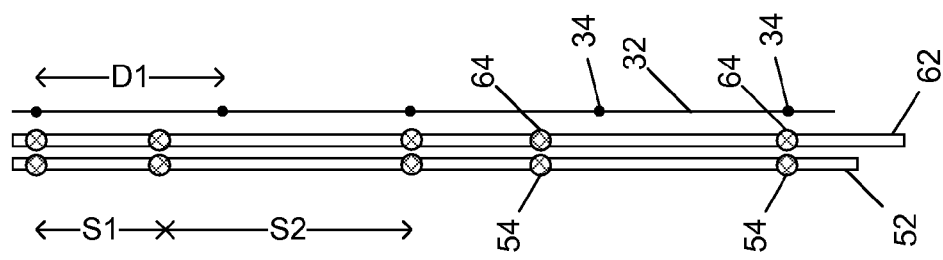

As shown in FIG. 9, the water supply and return taps can be arranged in a simple repeating pattern (e.g., no more than two or three different distances). For example, the distance between adjacent taps 54 can alternate between first distance 51 and second distance S2. The average distance (S1+S2)/2 can be two to ten feet. For example, the first distance 51 can be four feet, and the second distance be six feet. The distances 51 and S2 can be a simple ratio, e.g., S1=(N/M)*S2 where N and M are both less than 5. N/M can be less than 3. This permits tap spacing to be coordinated with raised floor tile/stanchion pitch (2 ft in US) while accommodating module 100 spacings that are not integer multiples of 2 ft.

Figure 10:
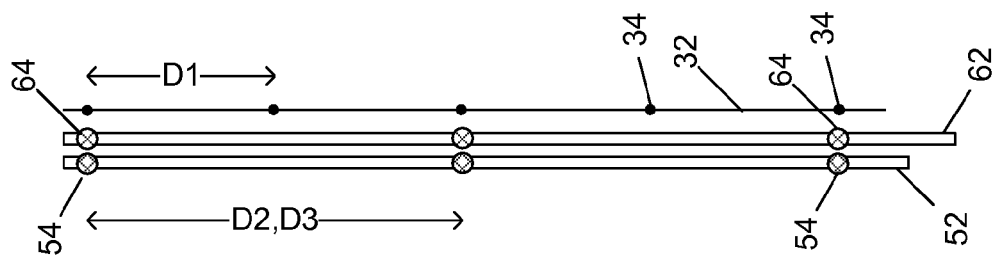

As shown in FIG. 10, as a more general case, rather than having the power taps 34 and water taps 54/64 have the same spacing, the distances D1 and D2 can be a ratio of small integers, e.g., D1=(N/M)*D2 where N and M are both less than 5. Similarly, the distances D4 between adjacent data taps can be a simple ratio of the distances D1 or D2 and D3. Having the distances be a ratio of small integers can simplify planning of data center layout. However, other ratios are possible. The power taps can be more closely spaced than the water taps 54/64.

The spacing of the coolant taps 54/64 (and number of spigots per tap) can be selected such that when a full complement of modules 100 has been installed and connected to an associated cooling line, substantially all, e.g., more than 90%, of the coolant taps on the line are used.

In general, since power taps are less costly than coolant taps, and because power taps may be needed for other purposes, the data center can be installed with more power taps than would otherwise be required by the modules. This also permits greater flexibility in electrical connection to the modules 100. The spacing of the power taps 34 (and number of receptacles per tap) can be selected such that when a full complement of modules 100 has been installed and connected to an associated power line, the modules use a plurality or majority but significantly less than all of the taps. For example, the modules can use more than 30%, e.g., more than 40%, e.g., more than 50%, of the power taps on the line. On the other hand, the modules can use less than 90%, e.g., less than 80%, e.g., less than 70%, of the power taps on the line. In one implementation, the modules use about 50% of the power taps on the line.

In addition, each pair of adjacent busbars or manifolds need not have the same spacing, but can be arranged in a simple repeating pattern (e.g., no more than two or three different distances). For example, the spacing between busbars can be closer for two busbars over modules that are disposed back-to-back (e.g., as shown in FIG. 5) than for two busbars over modules that are disposed across an aisle.

In general, the density of power taps 34, water taps 54/64 and data taps 74 can be such that no hose or cabling need be longer than about ten feet to connect the components of a module to the nearest taps. The density of power taps 34, water taps 54/64 and data taps 74 can each be substantially uniform across the area of the facility to be used for the modules (non-uniformity is more likely to arise along the walls of the building). Assuming that the ratio of water supply manifolds to power supply busbars is greater than 1:1, then each power supply busbar 32 can have a limited number of associated water supply and return manifolds (e.g., four or less each) that serve the same group of modules. Similarly, assuming that the ratio water supply manifolds to power supply busbars is less than 1:1, then each pair of water supply and return manifolds can have a limited number of associated power supply busbars 32 (e.g., four or less each) that serve the same group of modules.

Figure 11:
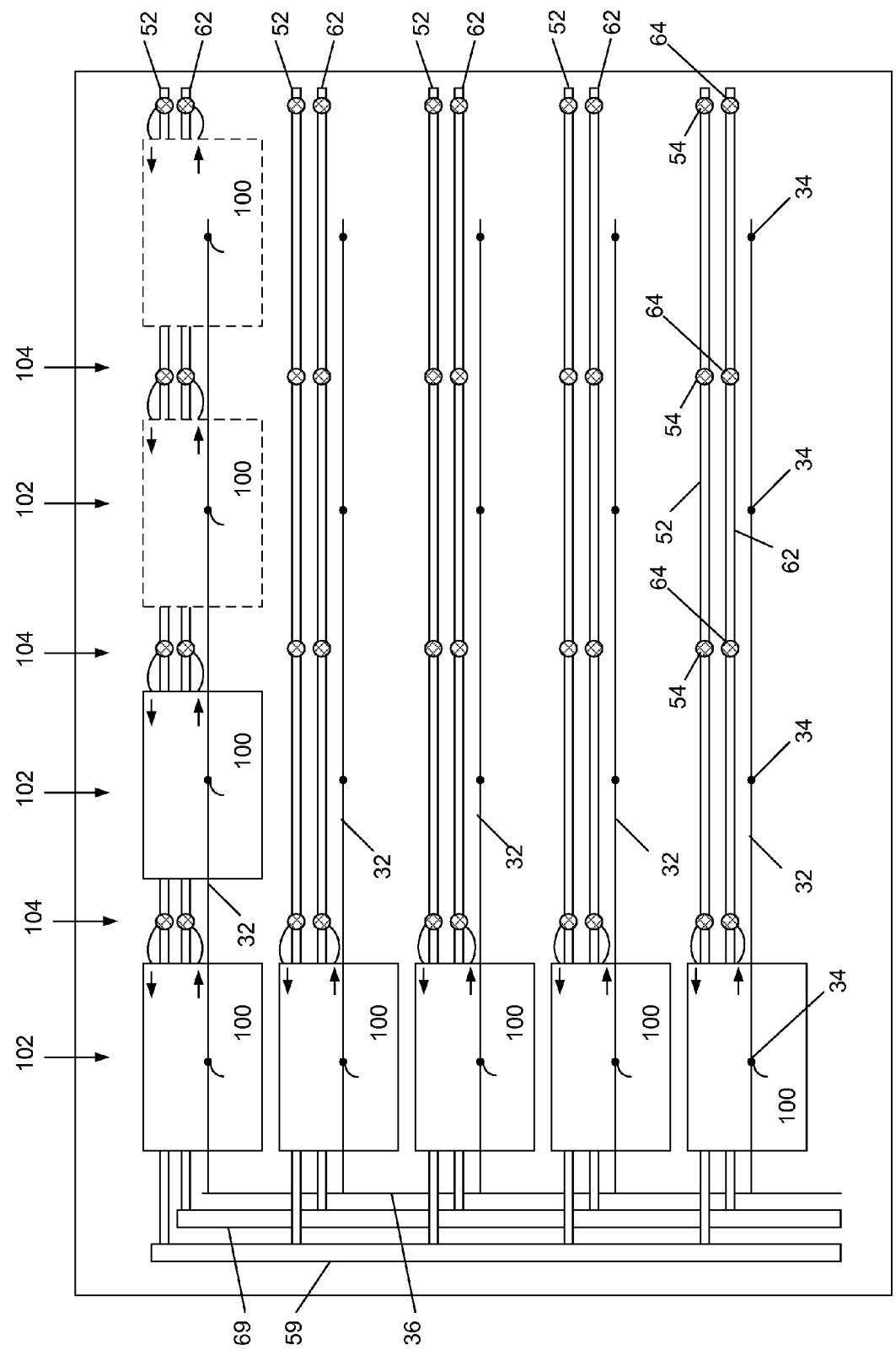

FIG. 11 is a plan view of another implementation of a facility with cooling and power grids operating as a data center. As shown, the lines of power taps 34 and water taps 54/64 can be arranged perpendicular to the rows 102 of modules 100. For example, the coolant supply manifolds 52 and coolant return manifolds 62 can extend under the raised flooring perpendicular to the rows 102 of modules 100 with taps 54 and 64 placed in the aisles 104 between the rows 102. The busbars 32 can run perpendicular to the rows 102, with taps 34 over the modules 100. In general, in this implementation, the spacing of the taps along the lines can be about equal to the pitch between the rows of modules, and the pitch of the lines of taps can be about equal to the spacing of modules within a row. However, the various modifications to tap layout described above with respect to FIGS. 4-10, e.g., modifications to pitch, spacing, staggering of the taps and lines, etc., can also be applied to the perpendicular arrangement. For example, coolant taps can be located every other aisle and service the modules on both sides of the aisle, or the supply and return taps for a given module can be located in aisles on opposite sides of a module.

A potential advantage to running the lines perpendicular to the row of modules is distribution of cooling and power load across different applications. Assuming that the rack-mounted computers in a given row 102 of modules 100 have similar applications, but that different rows of modules have different applications, then the perpendicular arrangement allows rack-mounted computers for different applications to be cooled by a common cooling plant. This can create an averaging effect on the cooling plant loads, so that spikes in activity for particular applications can be less likely to overwhelm the cooling capacity of a particular cooling plant. Similarly, the perpendicular arrangement allows rack-mounted computers for different applications to be powered by a common power supply. This can create an averaging effect on the power loads, so that spikes in activity for particular applications can be less likely to overwhelm the power capacity of a particular upstream piece of power distribution infrastructure, e.g., the capacity of a particular power distribution unit (PDU). This averaging effect and reduction in the spikes, can allow the deployment of an increased number of servers while still maintaining the appropriate equipment safety margins.

Figure 12:
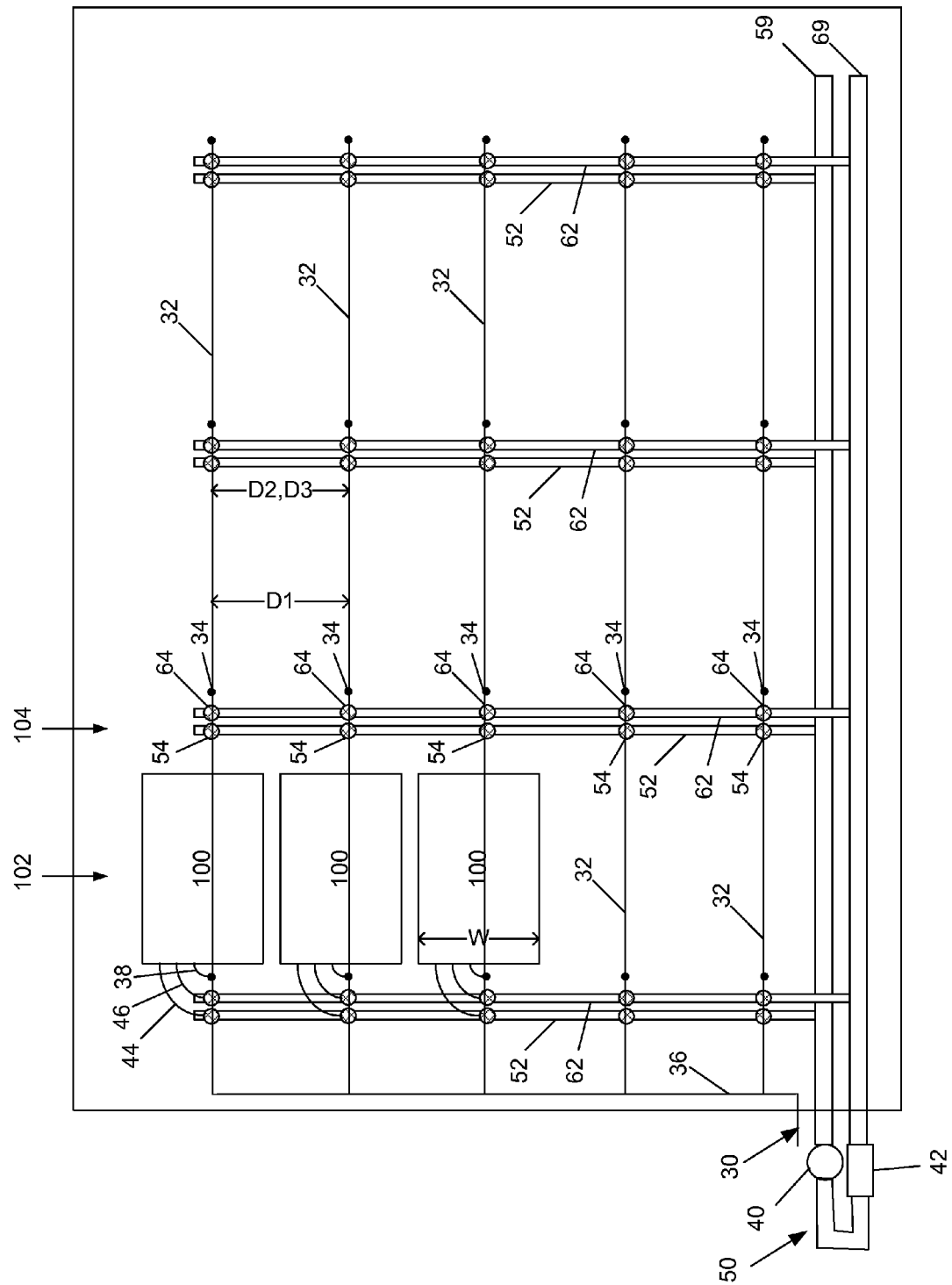
Figure 13:
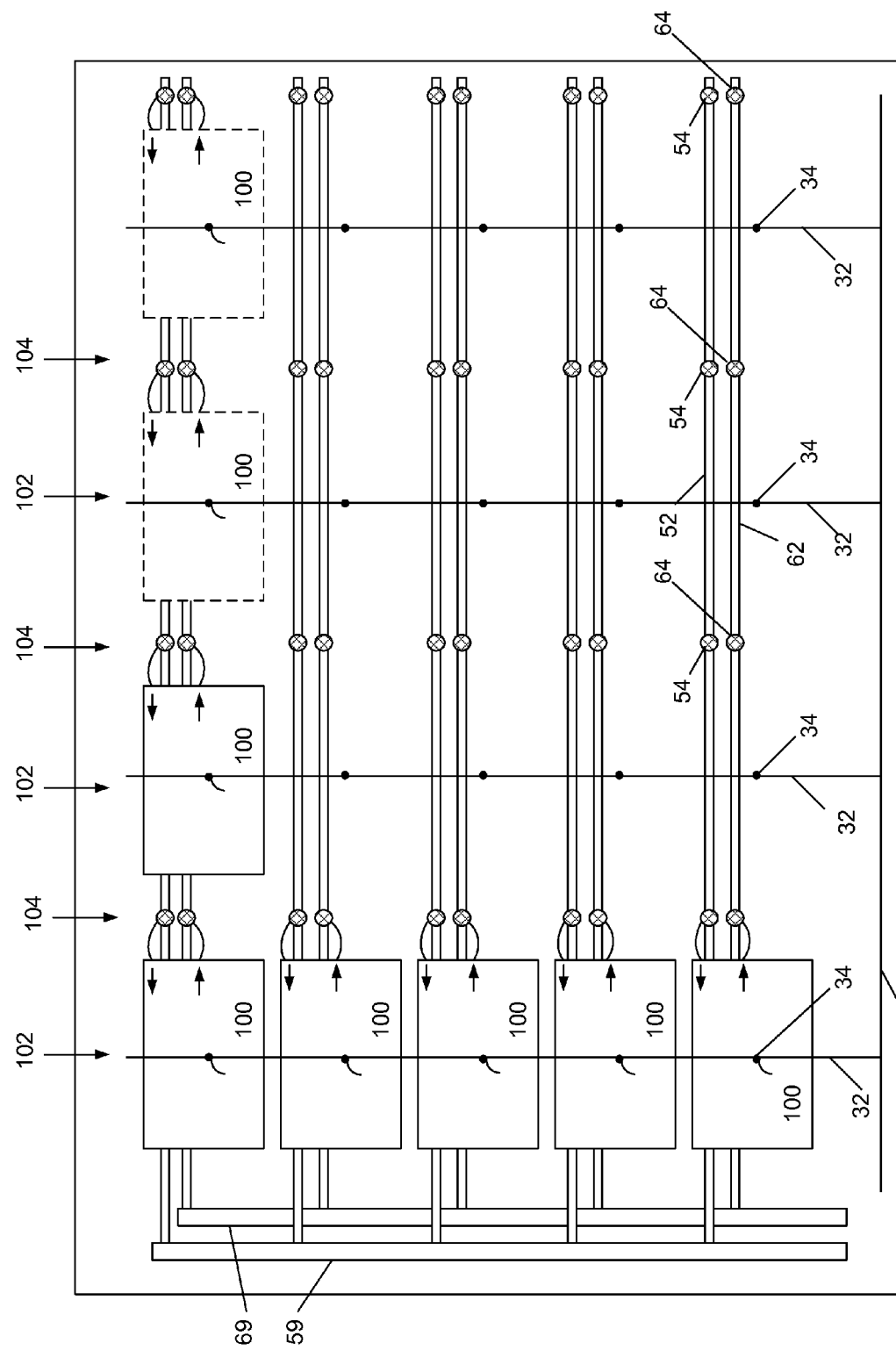

Although FIG. 11 illustrates both the lines of power taps 34 and water taps 54/64 arranged perpendicular to the rows 102 of modules 100, in other implementations only the lines 32 of power taps 34 (see FIG. 12) or only the lines 52/62 of water taps 54/64 (see FIG. 13) are arranged perpendicular to the rows 102 of modules 100. In particular, in one implementation, the lines of power taps 34 are perpendicular to the rows 102 of modules and the lines of water taps 54/64 are parallel to the rows 102 of modules 100. It can be more advantageous to provision the power perpendicularly than the cooling because insufficient cooling is a soft failure (a slight to modest increase in temperature) while for power provisioning, the failure mode is the tripping of a breaker or burning of a fuse. Thus, in the case of the failure of a line of power taps that is arranged perpendicular to the row of modules, the failure can be spread across multiple applications. As a result, for service provisioning, it is more likely that service for each application will be slightly impacted rather than having a catastrophic failure of service for one particular application.

Assuming that the rack-mounted computers in a row of modules has similar functionality, e.g., the rack-mounted computers function as search request servers, then the data lines can run parallel to the rows 102. However, this is not required, i.e., the data lines could also run perpendicular to the rows 102 of modules.

In general, any portion of the power, cooling or data grids could be supported from either the floor or ceiling. The raised floor 14 (and associated plenum 22) could be absent, and portions of grids described as running through the plenum could simply run along floor. Similarly, the suspended ceiling could be absent, and portions of grid described as in the suspended ceiling could be supported by or from the ceiling 16. There can be additional pumps or flow control devices; for example, there can be a pump for each manifold, or a pump at each tap. The power busbar 32, manifolds 52/62 and data cabling 72 are shown as linear, but could include turns; the path of the data cabling 72 and manifolds 52/62 can be substantially similar to the path of the busbar 32 (e.g., if the busbar includes a right-turn, the manifolds 52/62 will also include a right-turn, although the location of the turn relative to the busbar could be offset to maintain spacing for the module or provide uniform spacing between busbar and manifolds (as in the embodiment of FIG. 4)). A coolant other than water could be used.

There are several potential advantages of the facility 10. Since a computer module can be moved into place and then connected to nearby taps with flexible hoses, power cables and data cables, installation of the computer module is very simple and can be accomplished by the personnel of the operator of the data center without further need for contractors (specifically plumbing or electrical contractors). In addition, once a computer module is connected, it can begin operation essentially immediately. Thus, the data center can begin operating even if only part of the available space is used. Furthermore, in the event of maintenance or malfunction, the system of parallel power busbars and cooling manifolds enables the rack-mounted computers attached to one power and cooling line to be taken off-line while rack-mounted computers in other portions of the data center continue functioning.

A number of embodiments of the invention have been described. Nevertheless, it will be understood that various modifications may be made without departing from the spirit and scope of the invention. Accordingly, other embodiments are within the scope of the following claims.

What is claimed is:

1. A data center, comprising:
one or more enclosures defining an interior space;
a plurality of power lines, each of the power lines including a plurality of power taps in the interior space;
a plurality of coolant supply lines, each of the coolant supply lines including a plurality of coolant supply taps in the interior space;
a plurality of coolant return lines, each of the coolant return lines including a plurality of coolant return taps in the interior space; and
a plurality of clusters of modules in the interior space, each cluster located in a spatially contiguous area horizontally separated from other clusters by an access aisle, each module including a plurality of rack-mounted computers connected to a power tap adjacent the module and a cooling coil to remove heat from air near the rack-mounted computers, the cooling coil fluidly connected between a supply tap and a return tap adjacent the module;
wherein each cluster includes two or more modules, and wherein
the two or more modules in each cluster are serviced by a common coolant supply line and a common coolant return line, each of the two or more modules in each cluster are connected to different ones of the plurality of power lines, and the different ones of the plurality of power lines each service a plurality of clusters, or
the two or more modules in each cluster are serviced by a common power line, each of the two or more modules in each cluster are connected to different ones of the plurality of coolant supply lines and the plurality of coolant return lines, and the different ones of the plurality of coolant supply lines and the plurality of coolant return lines each service a plurality of clusters.

2. The data center of claim 1, wherein each of the two or more modules is connected to different ones of the plurality of power lines.

3. The data center of claim 1, wherein each of the two or more modules is connected to different ones of the plurality of coolant supply lines and the plurality of coolant return lines.

4. The data center of claim 1, wherein substantially all of the rack-mounted computers of a particular cluster are dedicated to the same application.

5. The data center of claim 1, wherein the rack-mounted computers of at least two different clusters of the plurality of clusters are dedicated to different applications.

6. The data center of claim 1, wherein the plurality of power taps are distributed with a substantially regular spacing in the interior space, the plurality of coolant supply taps are distributed with a substantially regular spacing in the interior space, and the plurality of coolant return taps are distributed with a substantially regular spacing in the interior space.

7. The data center of claim 1, wherein the power lines, the coolant supply lines and the coolant return lines are substantially linear.

8. The data center of claim 7, wherein modules are arranged in substantially linear rows.

9. The data center of claim 8, wherein the linear rows of the modules are perpendicular to the power lines.

10. The data center of claim 9, wherein the linear rows of the modules are parallel to the coolant supply lines and the coolant return lines.

11. The data center of claim 10, wherein the power lines are uniformly spaced.

12. The data center of claim 11, wherein the power lines are spaced with a pitch approximately equal to a spacing between modules in the rows.

13. The data center of claim 8, wherein the linear rows of the modules are perpendicular to the coolant supply lines and the coolant return lines.

14. The data center of claim 13, wherein the linear rows of the modules are parallel to the power lines.

15. The data center of claim 8, wherein the rows of modules are separated by access aisles.

16. The data center of claim 1, wherein at least two of the coolant supply lines and at least two of the coolant return lines are connected to different cooling plants.

17. The data center of claim 1, wherein the power taps are disposed with substantially uniform first spacing along the power lines, the supply taps are disposed with substantially uniform second spacing along the coolant supply lines, and the return taps are disposed with substantially uniform third spacing along the coolant return lines.

18. The data center of claim 17, wherein the second spacing is approximately equal to the third spacing.

19. The data center of claim 1, wherein the coolant supply lines and the coolant return lines are uniformly spaced with a first pitch.

20. The data center of claim 1, wherein the modules are distributed with a substantially regular spacing in the interior space.

* * * * *